United States Patent [19]

Liao et al.

[11] Patent Number: 4,645,562
[45] Date of Patent: Feb. 24, 1987

[54] DOUBLE LAYER PHOTORESIST TECHNIQUE FOR SIDE-WALL PROFILE CONTROL IN PLASMA ETCHING PROCESSES

[75] Inventors: Kuan Y. Liao, Irvine; Kuang-Yeh Chang, Los Gatos; Hsing-Chien Ma, Fremont, all of Calif.

[73] Assignee: Hughes Aircraft Company, Los Angeles, Calif.

[21] Appl. No.: 728,012

[22] Filed: Apr. 29, 1985

[51] Int. Cl.$^4$ .................. B44C 1/22; C03C 15/00; C03C 25/06; B29C 17/08
[52] U.S. Cl. .................. 156/643; 156/644; 156/646; 156/652; 156/653; 156/657; 156/661.1; 156/668; 156/904; 204/192.32; 427/38; 427/88; 357/65; 430/312; 430/313; 430/317
[58] Field of Search .............. 156/637, 643, 644, 646, 156/652, 653, 657, 659.1, 661.1, 904, 668; 430/312, 313, 317, 329; 427/43.1, 88, 38, 39; 204/192 E; 29/591; 357/65, 71

[56] References Cited

U.S. PATENT DOCUMENTS

| 4,354,897 | 10/1982 | Nakajima | 156/644 X |
| 4,461,672 | 7/1984 | Musser | 156/651 X |
| 4,484,978 | 11/1984 | Keyser | 156/643 |
| 4,523,976 | 6/1985 | Bukhman | 156/652 X |

FOREIGN PATENT DOCUMENTS

| 3215411 | 10/1983 | Fed. Rep. of Germany | 156/643 |
| 0007871 | 1/1979 | Japan | 156/643 |
| 0069264 | 5/1980 | Japan | 156/652 |
| 0083034 | 5/1982 | Japan | 156/643 |

OTHER PUBLICATIONS

IBM Journal of Research and Development, vol. 26, No. 5, Sep. 1982, A. S. Bergendahl et al, "Optimization of Plasma Processing for Silicon Gate FET Manufacturing Applications", pp. 580-589.
Solid State Technology, vol. 22, No. 4, Apr. 1979, P. D. Parry et al, "Antisotropic Plasma Etching of Semiconductor Materials", pp. 125-132.
IBM Technical Disclosure Bulletin, vol. 22, No. 1, Jun. 1979, J. S. Logan et al, "Process for Forming Tapered Vias in SiO$_2$ by Reactive Ion Etching", pp. 130-132.
Solid State Technology, vol. 27, No. 4, Apr. 1984, J. S. Chang, "Selective Reactive Ion Etching of Silicon Dioxide", pp. 214-219.
IBM Technical Disclosure Bulletin, vol. 22, No. 11, Apr. 1980, K. Chang et al, "Method for Controlling Via Sidewall Slope", pp. 4883-4885.
Patents Abstracts of Japan, vol. 6, No. 9, Jan. 20, 1982.

Primary Examiner—William A. Powell
Attorney, Agent, or Firm—Kenneth W. Float; A. W. Karambelas

[57] ABSTRACT

A photolithographic process useful for VLSI fabrication is disclosed for achieving side-wall profile control of poly lines, metal lines, contact and via openings. Layers of a first and second photoresist materials are formed on the poly, metal or oxide-covered substrate. The top layer is patterned by conventional processes to define the final device geometry. The bottom layer is exposed and over-developed to form an overhang structure about the line pattern or the contact/via opening. During the subsequent anisotropic plasma-assisted etching step, some ions or particles are passed obliquely over the overhang and bombard the opening corner, the side-wall and the under-cut area. The plasma-assisted etching step not only forms the poly or metal lines, or the contact or via opening, but also results in an opening with rounded corners and a smoothly tapered side-wall profile. The subsequent metal film deposition step results in a uniform film thickness around the edges of the opening. The process thus alleviates the problem of high contact resistance previously encountered as a result of dry etching the contact or via openings.

25 Claims, 12 Drawing Figures

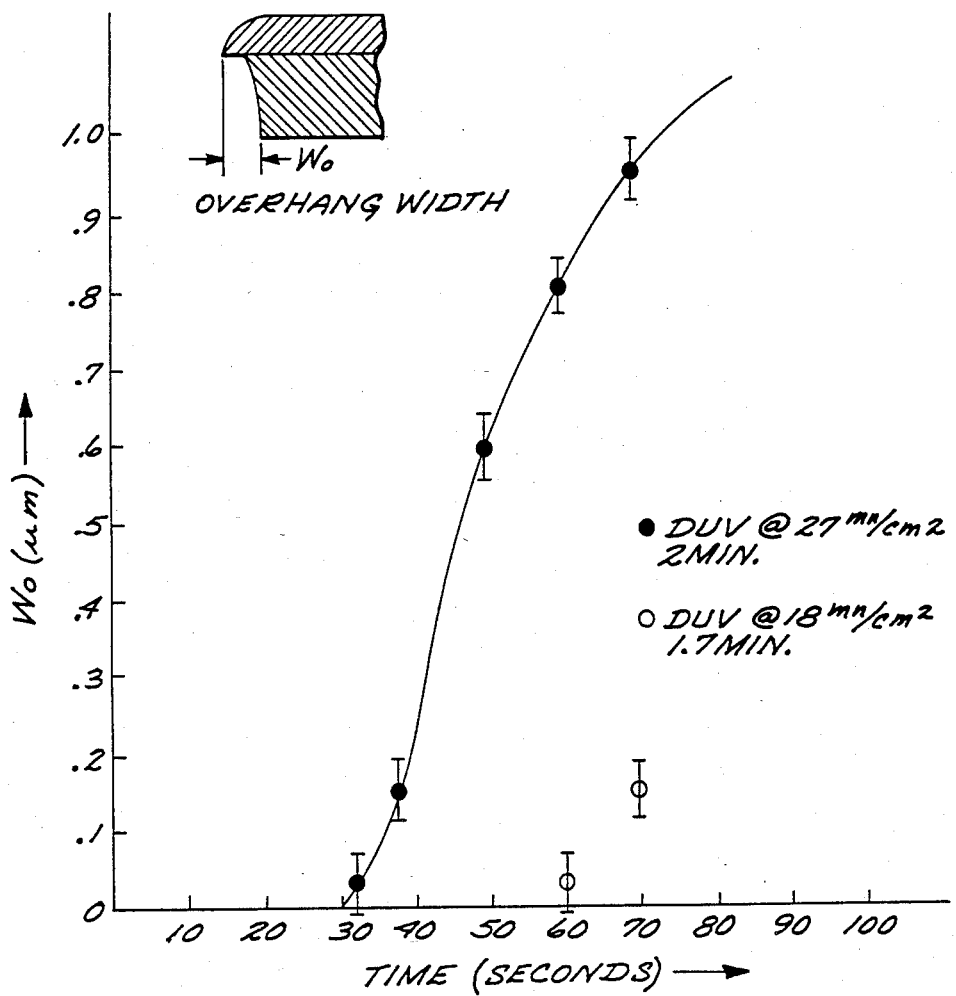
FIG. 3
FIG. 4A
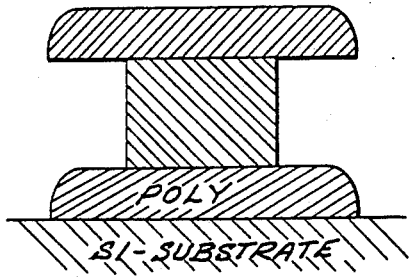
FIG. 4B
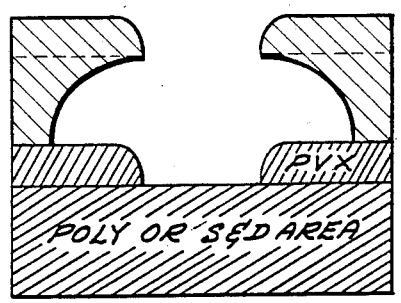

DOUBLE LAYER PHOTORESIST TECHNIQUE FOR SIDE-WALL PROFILE CONTROL IN PLASMA ETCHING PROCESSES

BACKGROUND OF THE INVENTION

The present invention relates to very large scale integrated circuit (VLSI) semiconductor manufacturing processes, and more particularly to methods for achieving tapered side-wall profiles in device surface layers via plasma etching processes.

isotropic etching is typically performed by wet chemical etching. The openings formed by isotropic etching typically are characterized by large undercut regions. Anisotropic etching is typically performed by dry plasma etching, forming an opening with vertical side-walls. The anisotropic plasma etching technique is in widespread use today to etch contact and via openings, for example.

Poor metal step coverage, especially over the contact or via holes formed by plasma etching in VLSI circuit chips, is a serious problem for circuit yield. The problem gets worse as the circuit dimensions get smaller.

As dry etching becomes one of the mainstream techniques in the VLSI technology, the problem of high contact resistance resulting from dry etching becomes a more significant factor in circuit yields. As is well known, the "metal 1" contact layer is the first metal layer formed on the wafer. The second metal layer or "metal 2" layer is formed over the metal 1 layer and an intervening insulator layer. High contact resistance may result in contacts between the metal 1 and metal 2 layers through via holes formed in the intervening insulator layer and in contacts between the metal 1 layer and polycrystalline silicon ("poly") or active areas which are formed through contact holes. The high contact resistance typically results from the steep side-walls of the contact or via holes which result from dry etching techniques used to form the contact or via holes.

To applicant's knowledge, there are two general techniques of solving the problem of high contact resistance associated with dry etching techniques. The first technique is to employ contact and via plugs; the second technique is to employ side-wall profile tapering of the contact and via holes. The present invention comprises an improvement to the second technique.

In general, applicants understand that the typical technique employed to achieve the tapered side-wall profile involves adding photoresist erosion gases such as oxygen during the plasma etching process. However, use of photoresist erosion gates exacerbates the problem of pinhole formation, and depends heavily on the uncontrollable photoresist flow step prior to plasma etching. Furthermore, the corner of the contact or via hole is not rounded when photoresist erosion gases are added during the plasma etch.

It is therefore an object of the invention to provide a process for side-wall tapering of contact and via holes in VLSI circuit chip wafers which results in virtually pinhole-free step metalization and smoothly tapered side-walls which are reproducible and profile controllable.

Another object of the present invention is to provide an improved metal contact process for the fabrication of VLSI circuits.

SUMMARY OF THE INVENTION

In order to achieve the above objects, we have discovered and developed a novel double layer photoresist process for achieving a tapered side-wall profile in a plasma etching process. In accordance with the invention, layers of two different photoresist materials are formed over the wafer. The top layer of photoresist is exposed and developed by conventional photolithographic methods to define the polysilicon, metal, contact or via patterns. The bottom layer of photoresist is subsequently deep UV exposed and over-developed to form an overhanging photoresist structure. A standard anisotropic plasma etching process follows without using any photoresist erosion gases. As a result of the shadow and diffraction effects of the plasma flowing through the photoresist overhang structure, some etchant particles will bombard the edge of the pattern projected on the substrate from the top layer of photoresist, thereby rounding the edge and tapering the side-wall. The tapered side-wall will improve the step coverage of the metal line over the etched pattern. The amount of side-wall profile tapering can be easily controlled by the thickness of photoresist and the degree of overhang.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 3 is a graph plotting the overhang width of the double layer photoresist overhand structure as a function of the developing time of the bottom layer.

FIG. 4(a) and 4(b) illustrate, respectively, the tapered side-wall profile of the poly ine and the contact/via opening after the plasma etch in accordance with the invention.

DETAILED DESCRIPTION OF THE PREFERRED EMBODIMENT

The present invention comprises a novel double layer photoresist technique for side-wall profile control in plasma etching. The following description is presented to enable any person skilled in the art to make and use the invention, and is provided in the context of a particular application and its requirements. In the following description, numerous specific details are set forth, such as specific temperatures, time periods, photoresist materials, solutions and the like, in order to provide a thorough understanding of the invention. It will be obvious to one skilled in the art that the present invention may be practiced without employing these specific details. In other instances, well-known steps are not described in detail so as not to obscure the invention.

Figure 1A:
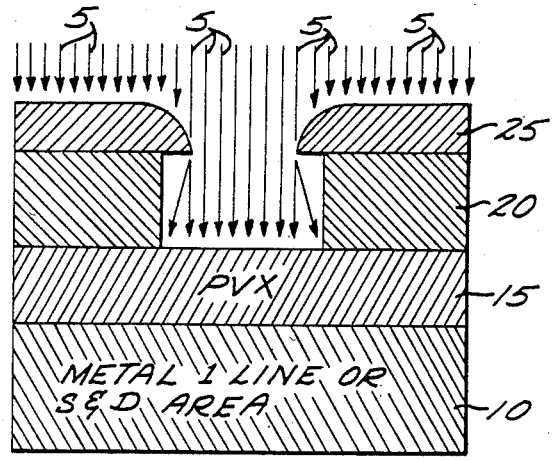
FIGS. 1a–c are partial cross-sectional views of a circuit wafer undergoing manufacture in accordance with principles of the invention, illustrating the metal step coverage improvement.
Figure 1B:
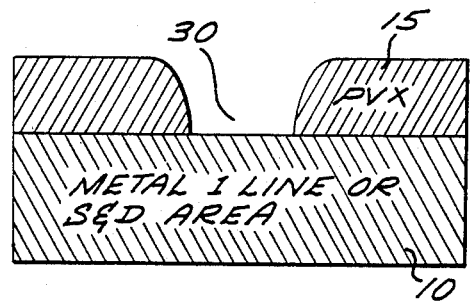
Figure 1C:
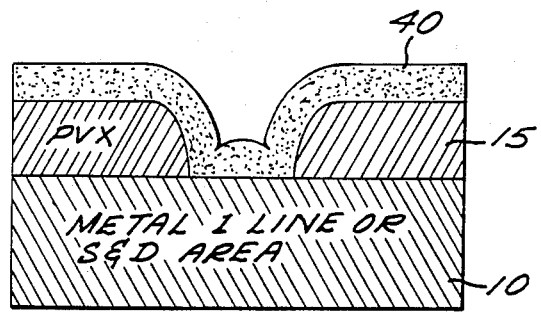

The inventive process is generally illustrated in FIGS. 1(a)–1(c), which shows the formation of a via or contact opening in accordance with the invention. An overhang structure comprising two photoresist layers 20,25 is formed on top of the PVX (phosphor-doped silicon glass) layer 15 formed on the wafer at the metal 1 or source/drain region. A planar-type anisotropic plasma-assisted etching step is carried out, with arrows 5 representing the plasma flow to selectively remove the PVX and form the via or contact opening 30. During this etching process, some plasma ions or particles pass around the overhang structure and bombard the corner, sidewall, and the undercut area as the PVX layer is selectively etched away.

Because of the overhang photoresist structure, the edge of the opening 30 is rounded and a tapered side-wall profile is achieved during the plasma etching process. This edge-rounding and side-wall tapering is depicted in FIG. 1(b), which shows the wafer after the photoresist layers have been stripped. A conventional metal deposition process is then carried out. The thickness of the metal film 40 will be uniform around the edges because the side-wall has been tapered smoothly, thereby substantially reducing the possibility of discontinuities in the metalization.

It is to be understood that there are many different types of plasma-assisted etching techniques known today. Generally, plasma-assisted etching may be considered to include, for purpose of this invention, such techniques as ion milling, sputter etching, reactive ion beam etching, reactive ion (or sputter) etching and plasma etching. While the invention is disclosed in the context of a specific type of plasma-assisted etching, namely, plasma etching, the invention is not limited to one specific etching technique, but may be employed advantageously with other plasma-assisted eteching techniques. The book *VLSI Technology*, edited by S. M. Sze, McGraw-Hill Book Company, 1983, describes plasma-assisted etching at Chapter 8.

Specific steps of the preferred embodiment of the process for side-wall profile control of contact openings are illustrated in greater detail by the series of cross-sectional diagrams of FIGS. 2(a)–2(f). An oxide layer 105 is formed by conventional techniques on the silicon substrate 100. This layer 105 may, for example, have a thickness of 6000 Angstroms.

The wafer is preheated at 250° C. for twenty minutes. A thin layer 110 (around 1.5 to 2 $\mu$m) of polymethyl methacrylate (PMMA) photoresist material is formed on top of layer 105. This positive photoresist material is marketed by KTI Chemical, Inc., and is exposed by radiation in the deep UV wavelength range. The photoresist is applied and the layer formed using a conventional spin technique to obtain a planarized layer. This coating process is followed by a high temperature reflow bake of the wafer at 190° C. for thirty minutes. The structure shown in FIG. 2(a) results.

Figure 2A:
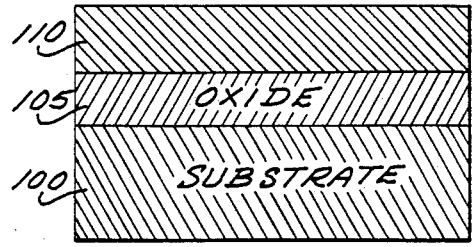
FIGS. 2a–f are partial views of a circuit wafer undergoing manufacture in accordance with principles of the invention.
Figure 2B:
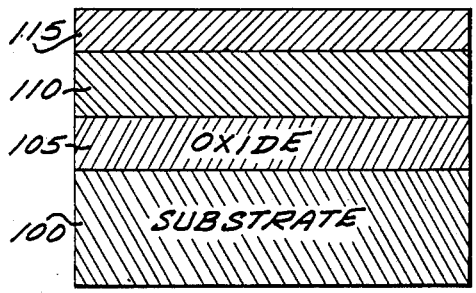

A thin layer 115 of Kodak 820 photoresist material is coated on top of the layer 110 of the (PMMA positive) photoresist. This positive photoresist material is marketed by the Eastman Kodak Company and is exposed by UV light having a wavelength of 436 nanometers. Layer 115 is about 0.5 to 1 $\mu$m thick. This second layer is applied and planarized by a similar spinning technique to that employed for the first layer. After this layer is applied, the wafer is baked at 90° C. for thirty minutes. The resulting structure is shown in FIG. 2(b).

In the next step of the process, the top layer 115 of the photoresist is exposed by ultraviolet light (UV) at a wavelength of about 436 nanometers, through a conventional contact mask to establish the contact pattern on the photoresist layer 115. The Kodak 820 photoresist layer is then developed in a 1:1 solution of waycoat developer and distilled water for 80 seconds, as in a conventional photolithographic process. The resulting structure, with openings 120 formed in layer 115, is shown in FIG. 2(c).

The wafer may then be inspected by a microscope to determine whether the top layer of photoresist has been developed completely. The interface 122 formed between the two photoresist layers 110,115 due to the chemical reaction of the two different types of photoresist materials may be descummed by a conventional plasma etch process. For example, the plasma etching apparatus marketed under the name "Plasmaline" by TEGAL Corporation, Novato, Calif., may be employed; typical descumming parameters are (i) 200 W power, (ii) 0.7 torr pressure and (iii) 25 ccm flow rate of $O_2$ gas for 1.5 to 2 minutes.

Figure 2C:
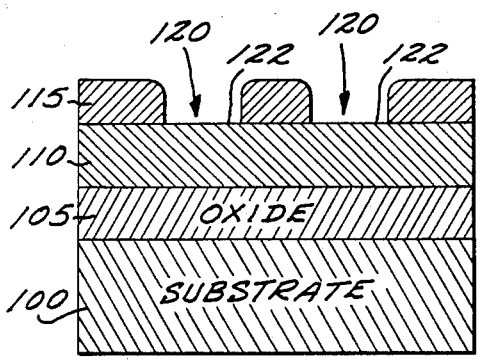
Figure 2D:
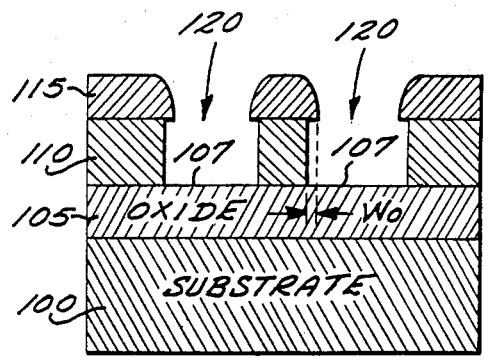
Figure 2E:
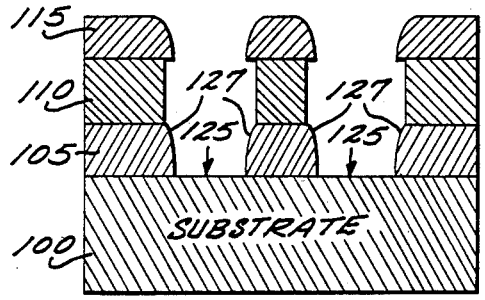
Figure 2F:
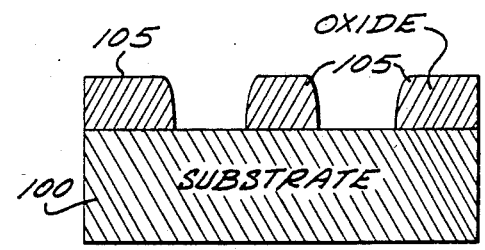

In the next step, the wafer as shown in FIG. 2(c) is flood-exposed by deep UV light at a wavelength of 220 $\mu$m and an intensity of 27 mw/cm$^2$ for one to three minutes. Following exposure, the PMMA photoresist is developed in chlorobenzene solution for 30 to 90 seconds, depending on the degree of overhang required. The developed wafer is then immediately immersed in zylene solution for 90 seconds, followed by a three-minute rinse in distilled water. The resulting double layer photoresist structure as shown in FIG. 2(d) defines an overhang structure around the periphery of the opening pattern, wherein around each opening, the lower photoresist layer has been undercut with respect to the upper layer. The openings 120 have been extended through the first and second layers of photoresist to the surface 107 of the oxide layer 105. The upper photoresist layer 115 overhangs by a width $W_o$ the lower photoresist layer 110 about the periphery of openings 120.

The degree of overhang obtained is a function of the developing process parameters. FIG. 3 is a graph which shows the relationship of the overhang width $W_o$ and the PMMA developing time, for two sets of exposure times and intensities.

Following the PMMA photoresist exposure and developing, the wafer is hard baked at 125° C. for thirty minutes.

The next step of the process is the conventional anisotropic plasma etching procedure. Plasma etching is a well-known process and the particular parameters of this step will depend upon the particular etching apparatus employed. However, as illustrated in FIG. 1(a), during anisotropic plasma etching, some ions or particles pass around the overhang structure and bombard the corner, the side-wall and the under-cut area, as the oxide layer is selectively etched away. This is the result of the shadow and diffraction-like effect of the plasma flow through the overhang structure. Thus, the side-walls of the contact hole are tapered smoothly and its edges rounded when the plasma etch has been completed.

As is well-known, the anisotropic plasma etching process is typically accomplished by setting up a large electric field across a pair of electrodes located in the etching chamber. The wafer to be etched is disposed in the chamber, typically adjacent one of the electrodes. Ionization gases such as $CHF_3$ and oxygen are then introduced into the etching chamber, and these gases are ionized from the bombardment resulting from the electric field acceleration to form $CF_3$ radicals. The $CF_3$ radicals react with the PVX or oxide layer on the wafer, etching the layer away.

A plasma etching device which may be employed in the process is the model AME 8110 system marketed by Applied Material, Inc., Santa Clara, Calif. Typical system and etching parameters used to etch an oxide layer about 6000 Angstroms in thickness are the following:

Power setting: 1300 W
Pressure: 50 m Torr
Gas: $CHF_3$ at 80 SCCM, $O_2$ at 10 SCCM
Etching time: 10 minutes The side-wall profile can be controlled by the deep UV exposure time, the PMMA developing time and the plasma etching time. The side-wall taper is increased as the overhang dimension $W_o$ is increased. By way of example, a typical dimension for $W_o$ is one micron and results in a 45° to 60° taper in the side-wall. The side-wall taper results from the shadow and diffraction-like effect of the overhang structure on the plasma flow. With the overhang structure the plasma radical concentration is greater at the surface of the non-shadowed region of the oxide layer than at the shadowed region surface.

Two examples of the resulting side-wall profile are illustrated respectively in FIGS. 4(a) and 4(b). FIG. 4(a) shows the side-wall profile of a poly line after the plasma etch process has been carried out. In this example, the poly layer is about 6000 Angstroms in thickness, and the PMMA and Kodak 820 layers are respectively 3 82 m and 1 $\mu$m in thickness. FIG. 4(b) illustrates the side-wall profile of a contact or via hole formed after the plasma etch. In this example, the PVX layer formed over the poly or source/drain area is about 6000 Angstroms in thickness, and the PMMA and Kodak 820 layers have respective thicknesses of 2 $\mu$m and 1 $\mu$m.

In the next step of the process, the photoresist layers are stripped from the substrate by immersal in acetone solution for twenty minutes, followed by ultrasonic vibration of the immersed wafer in an ultrasonic vibration tank for 10 to 30 seconds. Any remaining photoresist residue may be stripped by a conventional strip solution, such as solutions distributed by KTI Chemical, Inc. Once a photoresist material has been attacked by a plasma during an etching process, it is very hard to remove. With the double layer overhang structure, only the top layer of photoresist has been exposed to the plasma. As a result, immersal of the wafer in acetone dissolves the lower photoresist layer, so that the top layer may be lifted off during the ultrasonic vibration. The ease of removal is a distinct advantage. With conventional processes employing photoresist plasma erosion gases, an interface dielectric layer ($Al_2O_3$ or oxide) may form. With the disclosed double layer overhang structure, the overhang structure may be removed by the acetone and ultrasonic vibration method, thereby eliminating the possibility of the formation of the interface layer.

Following the steps described above, a metal film is deposited over the patterned wafer to form the contact. For example, a Varian model 3180 metal deposition system may be used to deposit a metal film of a nominal 0.6 $\mu$m thickness over the entire wafer surface. (The metal layer pattern is subsequently formed, for example, by an etching step after a metal pattern mask has been applied). The thickness of the metal film will be uniform and continuous around the edges of the contact hole because the edge has been rounded and the side-wall smoothly tapered. Because no photoresist erosion gases are used in the plasma etching step, the process is almost pinhole free.

Specific process steps which may be employed to carry out the disclosed process are set forth below.
1. Double layer photoresist coating
   (a) preheat wafer at 250° C., twenty minutes
   (b) coat PMMA photoresist material at 3000 RPM
   (c) bake the coated wafer at 190° C., thirty minutes
   (d) coat Kodak 820 photoresist layer
   (e) soft bake the coated wafer at 90° C., thirty minutes
2. Kodak 820 Exposing and Developing
   (a) Expose through contact mask by Canon mask aligner for 3 seconds, contact mode
   (b) Develop in 1:1 mixture of KTI developer and distilled water for 80 seconds
3. Descumming (twice)
   (a) 200 W power
   (b) 0.7 Torr pressure
   (c) 25 ccm flow rate of $O_2$ gas
4. Blanket deep UV Exposing HTE Deep UV System:
   (a) wavelength is 220 $\mu$m
   (b) intensity is 27 mw/cm$^2$
   (c) exposure time is 2 minutes
5. PMMA Developing
   (a) develop in chlorobenzene for 30 to 90 seconds
   (b) develop in xylene for 60 seconds
   (c) rinse in distilled water for 2 minutes and spin dry
6. Anisotropic plasma etch
7. Photoresist stripping
   (a) immerse in acetone for 20 minutes
   (b) ultrasonic vibration for 10 to 30 seconds
   (c) strip residue photoresist by microstrip solution One of the important aspects of the inventon is the implementation of the overhang structure preceding the anistropic plasma etching step. While the overhang structure has been implemented in the preferred embodiment by a double layer photoresist technique, an overhang structure may be implemented in other ways. For example, a tri-layer photoresist technique may be employed, wherein the first layer is a first photoresist material, the second layer is a thin layer of oxide formed on the first layer, and the third layer is a layer of a photoresist material, applied on the oxide layer. The hole pattern is formed in the top photoresist layer in a conventional manner by exposing the layer through a mask and thereafter developing the upper photoresist layer. The hole pattern is then formed in the thin layer of oxide by a plasma etch step. The underlying layer of photoresist may then be selectively etched away (without an exposure or developing process to the lower photoresist layer) through the opening pattern formed in the oxide layer by an isotropic plasma etching step. The top layer of photoresist is removed during this step, but the oxide layer selectively makes the lower photoresist layer. As a result of the isotropic etching of the lower photoresist layer, an overhang structure is formed, comprising the thin oxide layer and the lower resist layer.

The process for achieving side-wall profile control in accordance with the invention has a number of advantages. The double layer photoresist layer technique may be employed for geometry planarization and submicron line width resolution. The side-wall profile can be controlled by the overhang structure and the PMMA thickness which are stable during the anisotropic plasma etching. The overhang structure can be well-controlled by the exposure and developing times of the PMMA photoresist layer. The side-wall profile is not only edge-rounded but also smoothly tapered from top to bottom as a result of the shadow effect and the diffraction effect of the plasma through the photoresist pattern forming the overhang structure. No photoresist erosion gases are used during the process and, therefore, this process is virtually pinhole free. The photoresist layers can be stripped by an acetone solution and microstrip solution which eliminates the possibility of wafer oxidation during conventional plasma stripping processes.

The present invention is useful for etching such patterns as those defined by poly masks, metal line masks and contact masks. Thus, the invention is not limited to the formation of openings having tapered side-wall profile, but may also be used to form patterns, such as lines, defined by edges having a tapered side-wall profile.

It is understood that the above-described embodiment is merely illustrative of the many possible specific embodiments which can represent principles of the present invention. Numerous and varied other arrangements can readily be devised in accordance with these principles by those skilled in the art without departing from the spirit and scope of the invention.

What is claimed is:

1. A process for forming a smoothly contoured via opening in protective surface layer used in semiconductor device fabrication including the steps of:
    (a) directing a beam of etchant particles normal to a predefined surface area of said protective surface layer, and
    (b) deflecting particles in the portion of said beam corresponding to the edge of said via opening to vary the amount and intensity of particles striking the protective sidewalls of said via opening, whereby said sidewalls are formed with a smoothly rounded contour to thereby receive smoothly contoured metal-over-insulator contacts at high yields.

2. The process defined in claim 1 wherein said protective surface is formed initially on either a semiconductor substrate or a conductive layer.

3. The process defined in claims 1 or 2 wherein said beam of particles is deflected by extending a contoured mask into said beam of particles to provide a variation in amount and intensity of said beam proportional to the degree of contour of said mask.

4. An improved plasma-assisted etching process for use in integrated circuit fabrication for forming a pattern in a surface layer, comprising a sequence of the following steps:
    (i) forming a patterned masking layer on said surface layer, said masking layer having a predetermined pattern formed therein and arranged such that the masking layer comprises an overhang structure defining the periphery of said pattern; and
    (ii) etching said surface layer through the pattern in said masking layer by means of an anisotropic plasma-assisted etch to form sidewalls having a tapered profile in said surface layer in substantial correspondence with the pattern formed in the masking layer.

5. The improved process of claim 4 wherein the step of forming the patterned masking layer comprises the step of applying a layer of first photoresist material to the substrate layer.

6. The improved process of claim 5 wherein the step of forming the patterned masking layer comprises the additional step of applying a layer of a second photoresist material to the layer of the first photoresist material.

7. The improved process of claim 6 wherein the step of forming the patterned masking layer comprises the additional steps of:
    (i) exposing the first photoresist material through a mask bearing the predetermined opening pattern;
    (ii) developing the second photoresist to define the predetermined opening pattern therein;
    (iii) exposing and thereafter developing the first photoresist material through the opening pattern formed in the first photoresist material to form the overhang structure.

8. The improved process of claim 7 further comprising the step of removing the overhang structure.

9. The improved process of claim 8 wherein the step of removing the overhang structure comprises:
    (i) immersing the substrate in a solution adapted to dissolve the layer of the first photoresist; and
    (ii) subjecting the immersed wafer to ultrasonic vibration, whereby the layer of the second photoresist material is lifted away from the substrate.

10. The improved process of claim 4 wherein said suface layer comprises a poly layer and the layer pattern comprises poly lines.

11. The improved process of claim 4 wherein said surface layer comprises a metal layer and the layer pattern comprises metal lines.

12. The improved process of claim 4 wherein said layer pattern comprises a contact opening pattern.

13. An improved plasma-assisted etching process for use in integrated circuit fabrication for etching a pattern in a surface layer on a wafer, comprising a sequence of the following steps:
    (i) applying a first layer of a first photoresist material on the surface layer;
    (ii) applying a second layer of a second photoresist material to said first layer to form a double layer of photoresist materials;
    (iii) employing a mask to selectively expose the second layer of photoresist material and thereafter developing the second layer to provide a predetermined pattern in the second layer;
    (iv) selectively exposing and thereafter developing the first photoresist layer through the pattern formed in the second photoresist layer to form a photoresist overhang structure;
    (v) conducting a plasma-assisted etch to selectively etch the surface layer through the photoresist overhang structure; and
    (vi) stripping the photoresist materials from the substrate.

14. The invention of claim 13 wherein said plasma-assisted etch step comprises an anisotropic plasma etch.

15. The invention of claim 13 further comprising the step of depositing a layer of metal over the etched surface layer.

16. The invention of claim 13 wherein said mask employed to selectively expose the second layer of photoresist material comprises a contact mask.

17. The invention of claim 13 wherein the step of stripping the photoresist materials from the surface layer comprises:
    (i) immersing the wafer in a solution adapted to dissolve the first photoresist material; and
    (ii) subjecting the immersed wafer to ultrasonic vibration, whereby the second layer of the second photoresist material is lifted away from the surface layer.

18. An improved process for providing metal contacts on a wafer during VLSI fabrication, comprising a sequence of the following steps:
   (i) forming a patterned masking layer on the wafer, the masking layer having a predetermined pattern formed therein such that the masking layer comprises an overhang structure defining the pattern;
   (ii) etching said wafer through said opening pattern in the masking layer by means of an anisotropic plasma-assisted etch to form an etched pattern is said wafer having a tapered sidewall profile;
   (iii) removing the masking layer from the wafer; and
   (iv) depositing a metal layer over the wafer.

19. The invention of claim 18 wherein the step of forming a masking layer comprises the application of respective lower and upper layers of first and second photoresist layers.

20. The invention of claim 17 wherein the step of forming a masking layer further comprises:
   (i) exposing the top layer of photoresist material through a mask;
   (ii) developing the top layer of photoresist material to form a pattern in the top layer;
   (iii) exposing the bottom layer of photoresist material through the contact pattern in the top layer; and
   (iv) developing the bottom photoresist layer through the opening pattern formed in the top layer so that the the top layer overhangs the bottom layer around the periphery of the opening formed in the top layer.

21. The improved process of claim 13 wherein said surface layer comprises a poly layer and the layer pattern comprises poly lines.

22. The improved process of claim 13 wherein said layer pattern comprises a contact opening pattern.

23. The improved process of claim 22 further comprising the step of depositing metal over said patterned layer to form metal contacts.

24. A process for forming a smoothly contoured opening pattern in a protective surface layer used in semiconductor device fabrication, including the steps of:
   (a) directing a beam of etchant particles at a predefined surface area of said protective surface layer, and
   (b) deflecting particles in the portion of said beam corresponding to the edges of said opening pattern to vary the amount and intensity of particles striking the protective sidewalls of said opening pattern, whereby said sidewalls are formed with a smoothly rounded contour.

25. A process for forming a smoothly contoured opening pattern in a protective surface layer used in semiconductor device fabrication, including the steps of:
   (i) forming a patterned masking layer over said protective surface layer, the masking layer having a predetermined pattern formed therein such that the masking layer comprises an overhang structure defining the pattern;
   (ii) directing a beam of anisotropic etchant particles at a predefined surface area of said protective surface layer through said patterned masking layer; and
   (iii) deflecting particles from the edges of the openings patterned in said masking layer to vary the amount and intensity of particles striking said protective surface layer adjacent to the edges thereof, whereby said opening is formed in said protective surface layer sidewalls with a smoothly rounded contour.

* * * * *